(12) United States Patent
Law

(10) Patent No.: US 6,588,934 B2
(45) Date of Patent: Jul. 8, 2003

(54) SILVER-CONTAINING COPPER ALLOYS FOR JOURNAL BEARINGS

(75) Inventor: Chi C. Law, South Glastonbury, CT (US)

(73) Assignee: United Technologies Corporation, Hartford, CT (US)

( * ) Notice: Subject to any disclaimer, the term of this patent is extended or adjusted under 35 U.S.C. 154(b) by 32 days.

(21) Appl. No.: 10/021,008

(22) Filed: Oct. 29, 2001

(65) Prior Publication Data

US 2003/0081868 A1 May 1, 2003

(51) Int. Cl.⁷ .......................... F16C 33/06; F16C 43/02
(52) U.S. Cl. ................... 384/276; 384/913; 29/898.059
(58) Field of Search ................ 384/276, 280, 384/912, 913; 29/898.047, 898.054, 898.059

(56) References Cited

U.S. PATENT DOCUMENTS

| | | | | | |
|---|---|---|---|---|---|
| 2,392,917 | A | * | 1/1946 | Guinee | 384/912 |
| 2,994,654 | A | * | 8/1961 | Fahnoe et al. | 384/322 |
| 3,235,316 | A | * | 2/1966 | Whanger | 384/95 |
| 4,788,082 | A | * | 11/1988 | Schmitt | 427/248.1 |
| 4,904,362 | A | * | 2/1990 | Gaertner et al. | 204/192.12 |
| 4,978,587 | A | * | 12/1990 | Mori et al. | 428/645 |
| 5,571,332 | A | * | 11/1996 | Halpern | 118/723 HC |
| 5,842,531 | A | * | 12/1998 | McDowell | 384/95 |

* cited by examiner

Primary Examiner—Thomas R. Hannon
(74) Attorney, Agent, or Firm—Bachman & LaPointe, P.C.

(57) ABSTRACT

The present invention relates to a copper base alloy suitable for use in bearing structures. The copper base alloy consists of from about 15 wt % to about 90 wt %, preferably from about 50 wt % to about 60 wt %, silver and the balance essentially copper. The copper base alloy is advantageously applied to a surface of a component used in the bearing structure such as a surface of a bushing.

20 Claims, 1 Drawing Sheet

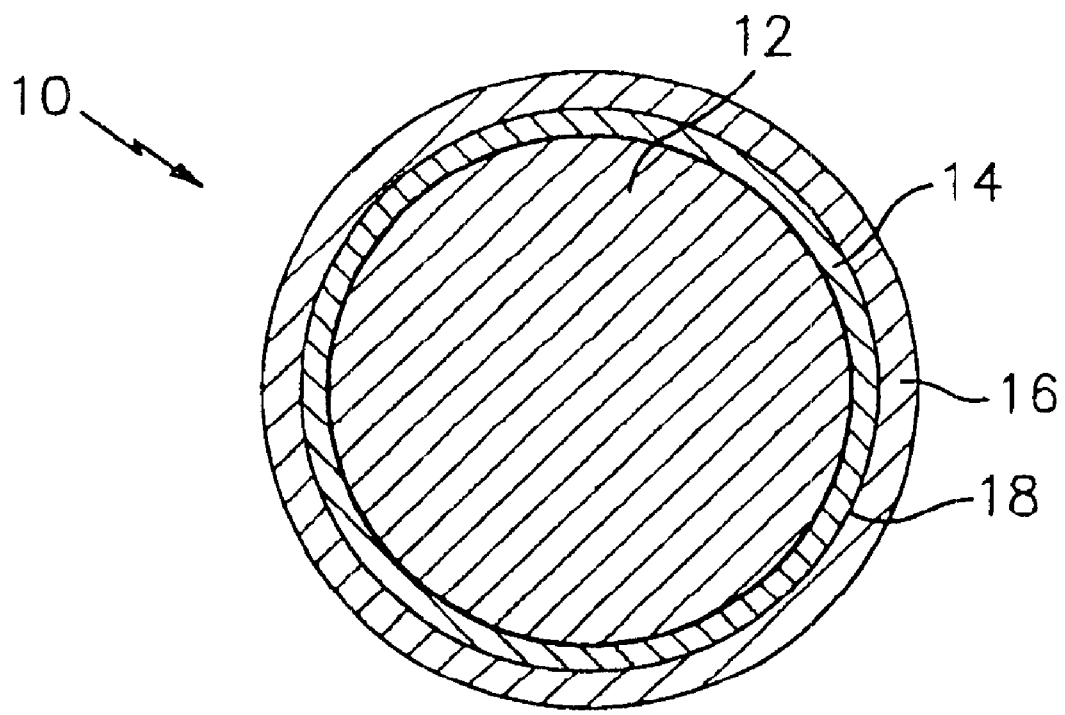

SILVER-CONTAINING COPPER ALLOYS FOR JOURNAL BEARINGS

BACKGROUND OF THE INVENTION

The present invention relates to a silver-containing copper alloy coating to be applied to a surface of a bearing component, such as a bushing, and to a method of applying the coating to the bearing component.

Journal bearings are used as structural support for rotating parts. Important requirements for journal bearing materials include lubricity, high thermal conductivity, and fatigue strength. Common metallic journal bearing materials include alloys of tin, lead, aluminum, and copper. Of particular interest for the journal bearings in a fan drive gear system are copper alloys which contain 21% to 30% lead. The lubricity of these copper alloys derives from the presence of lead particles which are uniformly distributed in the copper matrix. Under adverse operating conditions, frictional heating has been shown to cause incipient melting and subsequent loss of the lead in the surface layer. Seizure of the bearings occurs rapidly when lead is depleted from the surface.

Accordingly, there remains a need for alloy materials which can be applied to bearing component surfaces and which have higher incipient melting temperatures than lead-containing copper alloys.

SUMMARY OF THE INVENTION

It is an object of the present invention to provide a copper alloy which can be advantageously used in bearing structures.

It is a further object of the present invention to provide a copper alloy as above which has a higher incipient melting temperature than lead-containing copper alloys.

It is yet a further object of the present invention to provide a copper alloy as above which exhibits lubricity and high thermal conductivity.

It is still a further object of the present invention to provide a method for applying the copper alloy of the present invention to a bearing surface in the form of a coating layer.

The foregoing objects are attained by the copper alloy and the method of the present invention.

In accordance with the present invention, a copper alloy is provided for use in bearing structures. The copper alloy comprises a binary copper alloy consisting of from about 15 wt % to 90 wt %, preferably from about 50 wt % to 60 wt %, silver and the balance essentially copper. The copper alloy is applied to a surface of a bearing component.

A method for forming a bearing structure is also disclosed. The method broadly comprises the steps of providing a bearing component and applying a layer of a copper base alloy consisting of from about 15 wt % to about 90 wt % silver and the balance essentially copper to a surface of the bearing component. The bearing component may be a bushing used in a journal bearing.

Other details of the silver-containing copper alloys for journal bearings of the present invention, as well as other objects and advantages attendant thereto, are set forth in the following detailed description and the accompanying drawing wherein like reference numerals depict like elements.

BRIEF DESCRIPTION OF THE DRAWINGS

The FIGURE illustrates a bearing structure having a copper alloy coating in accordance with the present invention.

DETAILED DESCRIPTION OF THE PREFERRED EMBODIMENT(S)

Referring now to the FIGURE, a bearing structure 10 is illustrated. The bearing structure 10 includes a journal pin 12, a bushing 14 surrounding the journal pin 12, and a copper alloy coating layer 16 on a surface 18 of the bushing 14. The journal pin 12 and the bushing 14 may be manufactured from any suitable bearing material known in the art. For example, the journal pin 12 and the bushing 14 may be formed from an iron-based alloy or another non-ferrous alloy.

The copper alloy which forms the coating layer 16 is preferentially a binary silver-containing copper alloy. The copper alloy consists of from about 15 wt % to about 90 wt %, preferably from about 50 wt % to 60 wt %, silver and the balance essentially copper. It has been found that the copper alloys of the present invention provide significant benefits when used in bearing applications. For example, the copper alloys of the present invention have a higher incipient melting temperature than copper lead alloys, at least about 779° C. for the alloys of the present invention vs. 327° C. for the copper lead alloys. Still further, the alloys of the present invention are non-toxic and have a higher thermal conductivity than copper lead alloys. The alloys of the present invention also exhibit excellent lubricity and fatigue strength properties.

The copper alloys of the present invention may be applied to the surface 18 of the bushing 16 using any suitable technique known in the art, including but not limited to, physical vapor deposition, eletro-chemical deposition, and chemical techniques. One suitable technique which may be used to deposit the silver containing copper alloy on the surface 18 is the electron jet process shown in U.S. Pat. No. 5,571,332 to Halpern, which is hereby incorporated by reference herein. Yet another process which may be used is the deposition method shown in U.S. Pat. No. 4,788,082 to Schmitt, which is also incorporated by reference herein. A sputtering technique which may be used to form the coating layer 16 on the bushing surface 18 is shown in U.S. Pat. No. 4,904,362 to Craertner, which is also hereby incorporated by reference herein.

Regardless of the method employed, the copper alloy should be deposited on the surface so that it has a thickness which is sufficient to entrap large metal particles that might otherwise interfere with the operation of the bearing structure and cause the bearing to seize. The thickness of the layer 16 may be as much as 0.1 inches. Preferably, the copper alloy layer 16 will have a thickness in the range of from about 30 microns to 100 microns.

While the present invention has been discussed in the context of applying the copper alloy to a surface of a bushing, the copper alloy could also be deposited on one or more surfaces of other bearing components.

It is apparent that there has been provided in accordance with the present invention silver-containing copper alloys for journal bearings which fully satisfies the objects, means and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations as fall within the broad scope of the appended claims.

What is claimed is:

1. A bearing structure comprising:

a component and a coating applied to a surface of said component; and said coating being formed by a copper base alloy consisting of from about 15 wt % to 90 wt % silver and the balance essentially copper.

2. A bearing structure according to claim 1, wherein said silver content in said copper base alloy is in a range from about 50 wt % to 60 wt %.

3. A bearing structure according to claim 1, wherein said component is formed from a metallic material.

4. A bearing structure according to claim 1, wherein said component is formed from an iron based alloy.

5. A bearing structure according to claim 1, further comprising a journal pin and said component comprising a bushing surrounding said journal pin.

6. A bearing structure according to claim 1, wherein said coating has a thickness in the range of from an amount sufficient to entrap metallic particles to about 0.1 inches.

7. A bearing structure according to claim 6, wherein said coating thickness is in the range of from about 30 microns to 100 microns.

8. A bearing structure according to claim 1, wherein said copper base alloy has an incipient melting temperature of at least about 779° C.

9. A method for forming a bearing structure comprising:

providing a bearing component; and applying a layer of a copper base alloy consisting of from about 15 wt % to 90 wt % silver and the balance essentially copper to a surface of said bearing component.

10. A method according to claim 9, wherein said applying step comprises applying a layer of a copper base alloy consisting of from about 50 wt % to 60 wt % silver and the balance essentially copper to said surface of said bearing component.

11. A method according to claim 9, wherein said applying step comprises sputtering said copper base alloy onto said surface of said bearing component.

12. A method according to claim 9, wherein said applying step comprises depositing said copper base alloy onto said surface of said bearing component using an electron beam physical vapor deposition technique.

13. A method according to claim 9, wherein said applying step comprises using an electrochemical technique to apply said copper base alloy to said surface of said bearing component.

14. A method according to claim 9, wherein said applying step comprises using a chemical technique to apply said copper base alloy to said surface of said bearing component.

15. A method according to claim 9, wherein said applying step comprises applying said copper base alloy to said surface using an electron jet process.

16. A method according to claim 9, wherein said applying step comprises applying a layer of said copper base alloy having a thickness less than 0.1 inches on said surface.

17. A method according to claim 9, wherein said applying step comprises applying a layer of said copper base alloy having a thickness in the range of from about 30 to 100 microns on said surface.

18. A journal bearing comprising:

a journal pin;

a bushing surround the journal pin; and a coating on a surface of said bushing, said coating comprising a copper base alloy consisting of from about 15 wt % to 90 wt % silver and the balance essentially copper.

19. A journal bearing according to claim 18, wherein said silver content of said copper base alloy is in the range of from about 50 wt % to about 60 wt %.

20. A journal bearing according to claim 18, wherein said coating has a thickness sufficient to entrap metal particles.

* * * * *